Figure 1:
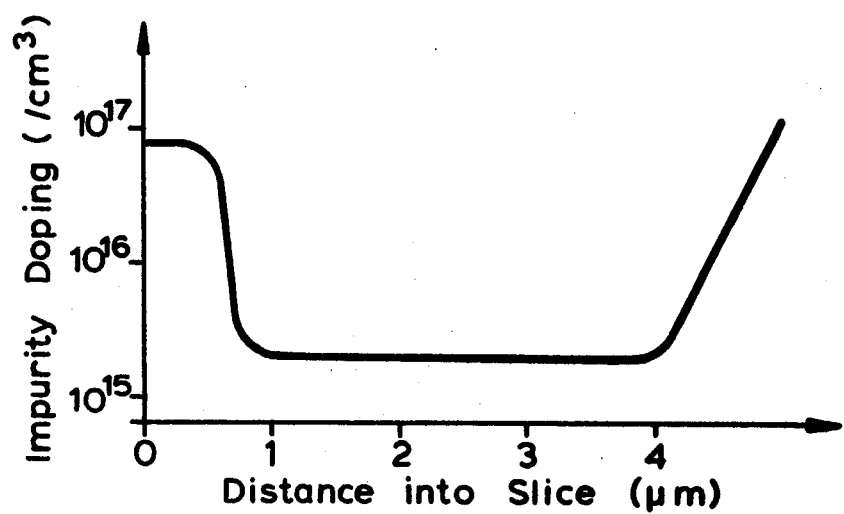

United States Patent [19]

Cooper et al.

[11] 4,099,318
[45] Jul. 11, 1978

[54] SEMICONDUCTOR DEVICES

[75] Inventors: Kenneth Cooper; Ian Stanley Groves; Peter Alexander Leigh; Neil McIntyre; Sydney O'Hara; John Donald Speight, all of Suffolk, England

[73] Assignee: The Post Office, London, England

[21] Appl. No.: 741,672

[22] Filed: Nov. 15, 1976

[30] Foreign Application Priority Data

Nov. 17, 1975 [GB] United Kingdom ............... 47339/75

[51] Int. Cl.² ........................................... B01J 17/00
[52] U.S. Cl. ..................................... 29/578; 29/580; 29/589; 29/590; 148/1.5; 156/645; 156/648; 204/15; 204/32 S; 204/192 EC; 357/13; 357/71; 357/81; 427/43; 427/82; 427/84; 427/89

[58] Field of Search ............... 357/13, 71, 81; 29/580, 29/578, 589–591; 148/1.5; 427/82, 84, 89, 43; 204/32 S, 15, 192, 192 EC, 192 E; 156/645, 629, 649, 648

[56] References Cited

U.S. PATENT DOCUMENTS

| 3,824,133 | 7/1974 | D'Asaro et al. ............. 148/1.5 |
| 3,925,880 | 12/1975 | Rosvold ................... 29/580 X |

Primary Examiner—William A. Powell
Assistant Examiner—Thomas Bokan
Attorney, Agent, or Firm—Kemon & Estabrook

[57] ABSTRACT

The invention relates to the fabrication of IMPATT diodes. The invention discloses a specific sequence of steps and enables diodes to be mass produced without technological variations.

5 Claims, 11 Drawing Figures

SEMICONDUCTOR DEVICES

This invention relates to a method of producing semiconductor devices and in particular to a method of fabricating IMPATT diodes. The invention concerns a sequence of steps which, although described in terms of discrete devices, enables the diodes to be mass produced without significant variation of the technology. In particular, the method consists of a series of physical and chemical techniques which results in the production of IMPATT diodes of high DC-RF efficiency and high reliability (lifetime). An indication of these characteristics is given below:

| Frequency | Output power | Efficiency DC-RF | Mean time to failure (350° C) |
|---|---|---|---|
| 11GHz | 6 Watts | 25% | 100 Hrs |
| 35GHz | 750mW | 10% | 250 Hrs |

The efficiency of an IMPATT diode is dependent upon its thermal characteristics and among modern techniques for IMPATT diode fabrication it has been shown that thermo-compression bonding of the commonly used Ga As substrate on to a heat sink is less efficient than a plated heat sink (PHS). In addition, another technique concerns the production of diodes embedded in semi-insulating Ga As formed by proton bombardment; this technique appears to give diodes superior to diodes formed as mesa structures from identical material. An essential step in the original proton bombardment work was a special technology for producing very thin, 3μm, layers of Ga As. This technology has now been superseded so that the proton bombardment process can now be used with thicker substrates, 15μm, which enables the diode devices to be more conveniently used with 50-line microstrip circuits.

According to one aspect of the invention there is provided in a method of producing a semiconductor device in the form of an IMPATT diode the steps of:
  selecting a slice of semiconductor material having an epitaxial layer on an n+ substrate material;
  diffusing a p+ layer into the epitaxial layer to form an abrupt p+-n junction;
  removing the uppermost 80 to 120Å of the diffused p+ layer by RF sputter etching under plasma conditions thereby inhibiting change in surface crystal structure;
  thinning the n+ substrate material to a desired thickness for the device;
  producing a photolithographic mask on the surface of the n+ substrate material;
  depositing, by sputtering, on both the p+ and n+ surfaces a succession of layers of titanium, 800 to 1200Å, platinum, 1600 to 2400Å, and gold, 8000 to 12000Å, and electroplating gold layers over the sputtered gold layers; removing the photolithographic mask to expose the surface of the n+ substrate material around a series of gold pads;
  by high energy proton bombardment, passivating the zones of semiconductor material in depth through the slice to create zones of semi-insulating material to isolate the semiconductor material directly below the gold pads, the energy of protons being increased in stages at intervals of less than 0.11MeV up to an energy in MeV approximately equal to one-tenth of the required passivated layer thickness in μm using a proton dose at each stage of from $10^{14}$ to $5 \times 10^{15}$ per $cm^{-2}$ and a rate of from $2 \times 10^{12} sec^{-1}$ to $5 \times 10^{12} sec^{-1}$ using a proton scan raster pattern ensuring uniformity of dose over the area of the device; and
  mounting the processed semiconductor material on to a heat sink and connecting one or more of said gold pads to a connection block.

The photolithographic mask can be produced in two stages so that the plated gold layer has a thickness of from 8 to 12μm and a diameter from 10 to 35% less than that of the sputtered layers. The n+ substrate material is preferably thinned in a two stage process comprising abrasive lapping down to 60 to 80μm and chemical etching down to 10 to 15μm.

In order to obtain IMPATT diodes with the performance characteristics tabulated above, the semiconductor material selected should have less than $10^3$ defects $cm^{-3}$.

Following p+ diffusion, the diffuse surface should be thoroughly cleaned, preferably successively with organic solvents, concentrated acids and distilled water.

The invention also extends to IMPATT diodes produced by the methods hereinbefore defined.

Figure 8:
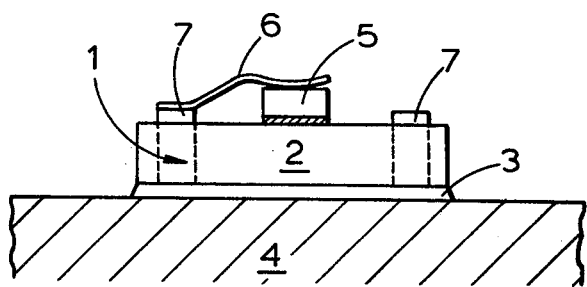
Figure 9:
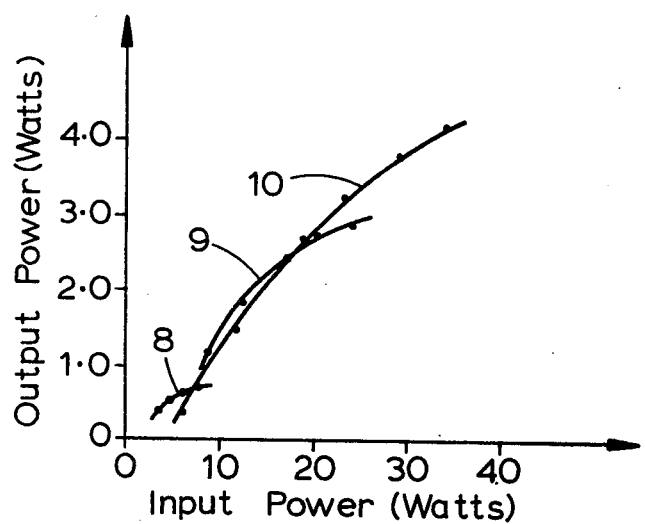
Figure 10:
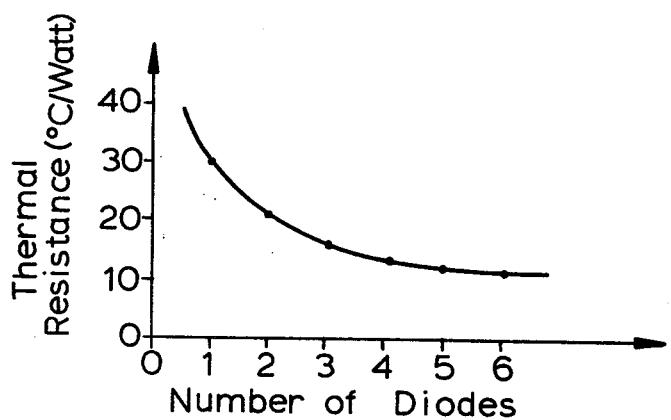
Figure 11:
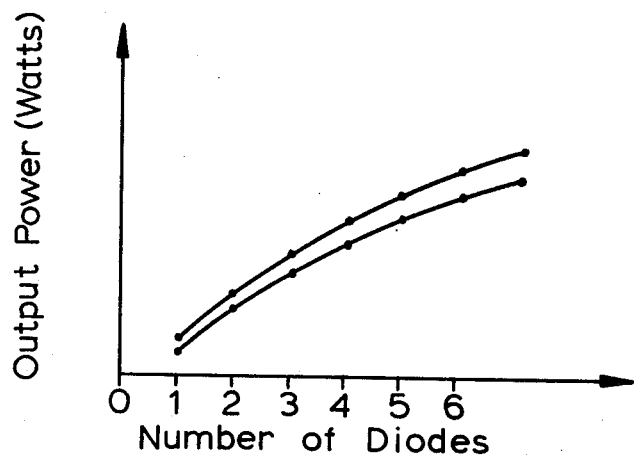

The invention will now be described by way of example with reference to the accompanying diagrammatic drawings in which:
  FIG. 1 shows the impurity doping profile of a Ga As slice for use in fabricating an IMPATT diode;
  FIGS. 2 to 7 show the sequence of stages in the processing of a Ga As slice in producing an IMPATT diode;
  FIG. 8 shows a processed slice mounted on a heat sink;
  FIG. 9 shows the relationship between input and output power for single and multiple devices;
  FIG. 10 shows the graphical relationship between thermal resistance and the number of diodes mounted in parallel; and
  FIG. 11 shows graphically the relationship between output power and the number of diodes mounted in parallel.

The basic Ga As semiconductor material is checked for suitability firstly by subjecting the material to X-ray topography to determine the number of crystal defects; if the defect density exceeds $10^3$ defects $cm^{-3}$, the material is rejected. Secondly, the material is subjected to an automatic carrier concentration to depth profile measurement plotter which produces for suitable material the graph shown in FIG. 1.

This is achieved by measuring the capacitance C and its rate of change with voltage dC/dV. The output from the measuring arrangement is applied to an XY plotter to obtain the graph shown in FIG. 1.

Impurities doping $$N_d = \frac{16C^3}{\pi^2 D^4 K} \left( \frac{dC}{dV} \right) \tag{1}$$

at depth $$x = \frac{\pi. K. D^2}{4 C} \tag{2}$$

Figure 2:
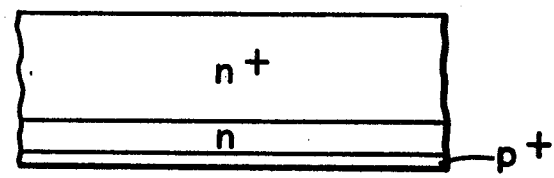

Having determined that the slicing material is adequate for the purpose, the slice of Ga As is subjected to a zinc diffusion process to produce a slice shown diagrammatically in FIG. 2. The formation of the active p$^+$-n junction is formed by placing a boat containing the Ga As slice in an evacuated quartz capsule together with a ternary compound of zinc, gallium and arsenic. The quartz capsule is sealed with quartz wool and a quartz thimble end plug. Zinc is a p-type dopant which is diffused into the n-type Ga As slice in a known manner to form the p-n junction. The advantage of this technique is the formation of an abrupt junction profile and the control of the junction depth to 0.35μm. By using a sealed capsule for the diffusion process the loss of arsenic may be controlled. As shown in FIG. 2, the slice consists of an n$^+$ substrate 5mm in diameter and approximately 0.4mm thick and an n epitaxial layer 4μm thick on which the p$^+$ layer (zinc diffused) has been formed 0.3μm thick.

The p$^+$ surface is then thoroughly cleaned, successively in organic solvents, trichlorethylene and methanol, in concentrated acids, sulphuric and hydrochloric (one minute in a bath of each), and finally in doubly distilled water. These cleaning steps are important since they determine the overall integrity of the device structure.

Figure 3:
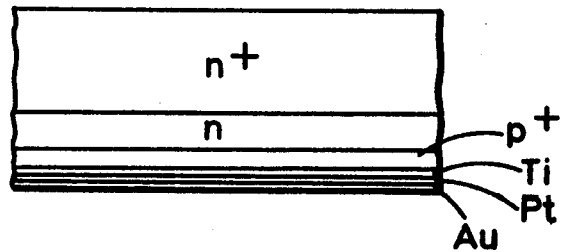

The zinc diffused slice is then subjected to a metallisation process illustrated in FIG. 3. The uppermost 80 to 100Å of the diffused p$^+$ layer are first removed by RF sputter etching under plasma conditions. A radio frequency is used in order to neutralise any electrical charge generated at the surface of the semiconductor material which if introduced into the crystal surface would inhibit further sputtering.

Subsequently, the slice, mounted on a water-cooled table in the sputtering chamber, has three successive layers of metal applied to the zinc diffused p$^+$ layer. Firstly, a layer of titanium 1,000Å thick is applied to the p$^+$ layer; then a layer of platinum 2000Å thick is applied to the titanium layer; finally a gold layer 10,000Å thick is applied to the layer of platinum. Variation of the thickness of these layers up to about 20% can be tolerated but the effect of having layers thinner than this is to raise the operating temperature thereby reducing device lifetime, while the effect of thicker metal layers is to promote stresses in the device. A triode sputtering process using a filament and anode to provide additional electrons enabling the discharge to be maintained at lower pressures is used. The triode sputtering process enables pure films to be deposited. The atmosphere within the sputtering chamber is preferably a low pressure argon gas atmosphere. The metal contact formed on the p$^+$ layer is to provide electrical connection between a heat sink and the Ga As semiconductor material. The three layers of titanium, platinum and gold are deposited instead of a theoretically ideal single layer to optimise the required adhesion and high conductivity necessary for device reliability and performance.

The metallised slice is then mounted in a holder on the cathode of a gold plating bath which is continuously stirred to ensure an even deposition of gold. The gold plating solution used is a neutral cyanide solution chosen to give high purity and a stress-free deposit. Stresses in the deposit must be avoided to prevent cracking of the Ga As. Because thermal conductivity is crucial to high power operation of the diode, the gold layer should have low porosity thus ensuring high thermal conductivity. The gold is deposited with a current density of between 3 and 15mAcm-2 at a temperature between 45° and 65° C to achieve a plating rate of approximately 110 mgm A.min$^{-1}$. The gold is electroplated on to the sputtered gold layer to an approximate thickness of 250μm. This electroplated gold forms a heat transfer path to a heat sink to provide dissipation of approximately 20 watts of heat during operation.

It has been found that electroplated gold provides a more efficient heat sink than the known technology of thermo-compression bonding of Ga As to a heat sink. The next stage in the process illustrated in FIG. 5 concerns the reduction in thickness of the Ga As substrate. The n$^+$ Ga As slice is abrasively lapped to a thickness of form 60 to 80μm using successively finer abrasives and a rotating lapping wheel as is well-known in the art. It has been found that this lapping process introduces damage into the Ga As and a final layer of partly damaged material is removed by a chemical etching technique known as bubble etching. The etchant used is a mixture of three parts sulphuric acid, one part hydrogen peroxide and one part water. Argon is bubbled through the solution to provide the necessary agitation during the bubble etching process. The accuracy and flatness of this two stage process is to within 2μm. The lapping operation is performed to reduce parasitic resistance in the final diode device.

Figure 4:
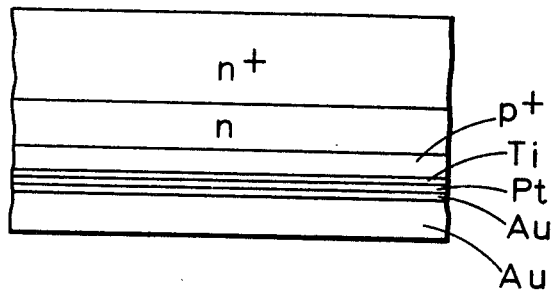
Figure 5:
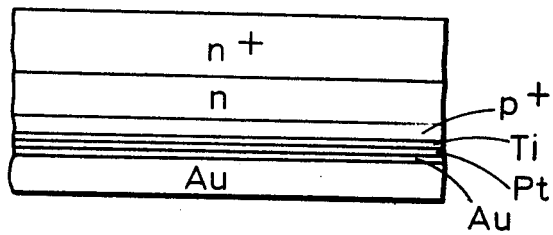
Figure 6:
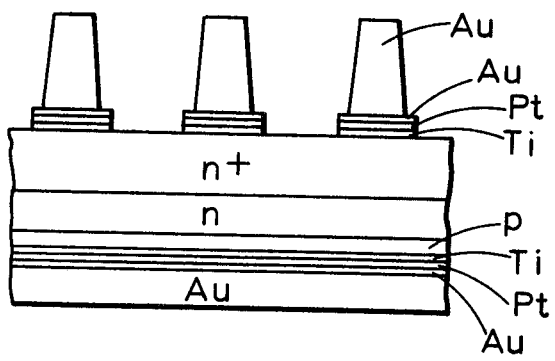

A photolithographic mask is then produced on the Ga As substrate to define areas 125μm in diameter where the diodes are to be located. The stages described with reference to FIGS. 3 and 4 are then repeated to produce bonded gold shields on the substrate material. As described with reference to FIG. 4 the gold is electroplated through the photolithographic mask to a thickness of 10μm. The mask is produced in a two stage process so that the finally plated gold pads have diameters some 30% less than the diameters of the sputtered layers. In this way, distortion of the gold pads which inevitably occurs when gold contact tape is thermo-compressively bonded to the pads does not cause stray gold-Ga As contacts which are often responsible for burn-out in Ga As IMPATT diodes. The photolithographic mask is subsequently removed from the n$^+$ side of the substrate to leave the structure shown in FIG. 6.

Figure 7:
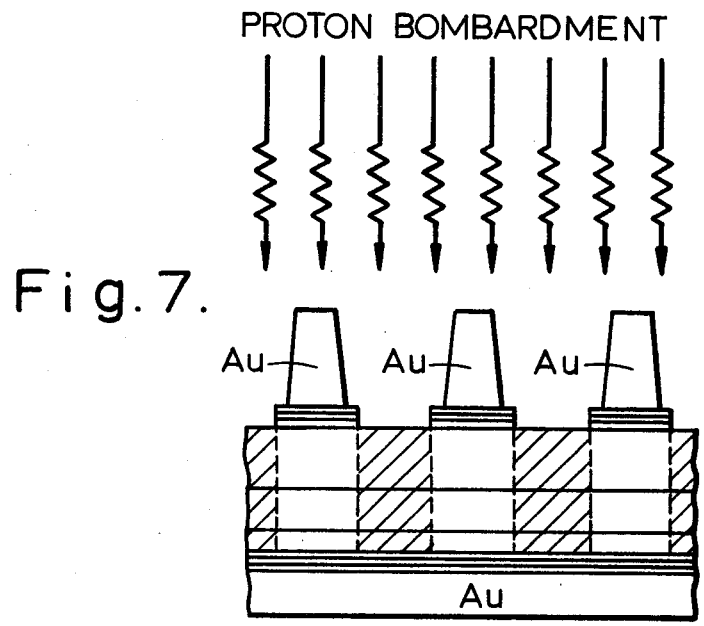

Referring now to FIG. 7 a Van der Graaf accelerator is used to produce high energy proton bombardment of the surface of the Ga As in order to passivate or increase the resistivity of the semiconductor. The resistivity introduced into the Ga As is dependent upon the proton dose; the depth of passivation is dependent on proton energy and occurs throughout the material in all regions not protectively covered by the gold pad shields.

The energy of protons is increased in stages at intervals of less than 0.11MeV up to an energy of 1.5MeV. The maximum energy may vary with the depth of passivation but a rough guide is 0.1MeV per um. Using a greater interval than 0.11MeV can cause damage at the limit of proton penetration for a given proton dose. By chosing the time interval of each bombardment stage, it is arranged that a dose of $4 \times 10^{14}$ protons cm$^{-2}$ is delivered at each stage. The number of protons at each stage can vary between $10^{14}$ and $5 \times 10^{15}$ depending on the degree of passivation required. The dose rate is from $2 \times 10^{12}$sec$^{-1}$ to $5 \times 10^{12}$sec$^{-1}$: too high a dose rate produces excessively high temperature at the device surface causing irreversible damage to the device structure.

The gold pads on the surface of the substrate define the 125μm diameter diode areas. The proton implanted semi-insulating zones are shown by shading on FIG. 7. The proton beam produced in the Van der Graaf accelerator is of small cross-section (of the order of 1mm$^2$) and is scanned in a raster pattern to give uniform dopage across a bombarded area of, for example, 25 to 30mm$^2$. This proton isolation technique produces a higher yield of diodes from a given slice than previous etching methods which also gave rise to problems of under-cutting. The final stage in the production of the diode is shown in FIG. 8 in which the IMPATT diodes 1 in the slice 2 which is mounted by way of a solder fillet 3 on to a copper heat sink 4 are all interconnected to a central quartz block 5 by way of gold tapes 6 (only one of which is shown) between the plated gold pads on top of each diode and the central quartz block 5 which is approximately 125μm$^2$.

The quartz block is attached to the surface of the substrate by a high strength epoxy adhesive. The quartz block has its top surface metallised so that the gold tape 6 may be attached between the pad 7 and the top surface of the block 5 by thermo-compression bonding.

FIG. 9 shows the relationship between input and output power for a single device (line 8) and multiple devices (lines 9 and 10).

FIG. 10 shows the relationship graphically between the thermal resistance of IMPATT DIODES connected in parallel and the number of diodes. In FIG. 11 the relationship between the output power and the number of diodes connected in parallel is shown.

It will be appreciated that the diameter of the IMPATT diode is limited by the circuit in which it is to be connected. It has been found that for reliability the junction temperature should be kept below 200° C. The diodes used to produce the graphical results shown in FIGS. 9 to 11 were operated at 10GHz. Such devices have been found particularly useful in microwave radio and millimetric chunk waveguide comunication systems.

The process hereinbefore described ensures good uniformity of device area and breakdown voltage which enables large numbers of devices to be parallelled. By parallelling the devices, the power handling capacity may be increased almost linearly as shown in FIG. 11.

Although the description is directed only to the fabrication of fully isolated planar Ga As IMPATT diodes from relatively thick (15μm) Ga As layers using proton bombardment, it must be emphasised that the process can be extended to thicker layers and to the fabrication of, for example microwave integrated circuits.

What is claimed is:

1. In a method of producing a semiconductor device in the form of an IMPATT diode, the steps of:

selecting a slice of semiconductor material having an epitaxial layer on an n$^+$ substrate material;

diffusing a p$^+$ layer into the epitaxial layer to form an abrupt p$^+$-n junction;

removing the uppermost 80 to 120Å of the diffused p$^+$ layer by RF sputter etching under plasma conditions thereby inhibiting change in surface crystal structure;

thinning the n$^+$ substrate material to a desired thickness for the device;

producing a photolithographic mask on the surface of the n$^+$ substrate material;

depositing by sputtering, on both the p$^+$ and n$^+$ surfaces a succession of layers of titanium, 800-1200Å, platinum 1,600-2,400Å, and gold, 8000-12,000Å, and electroplating gold layers over these sputtered gold layers;

removing the photolithographic mask to expose the surface of the n$^+$ substrate material around a series of gold pads;

by high energy proton bombardment, passivating the zones of semiconductor material in depth through the slice to create zones of semi-insulating material to isolate the semiconductor material directly below the gold pads, the energy of protons being increased in stages at intervals of less than 0.11MeV up to an energy in MeV approximately equal to one-tenth of the required passivated layer thickness in μm using a proton dose at each stage of from $10^{14}$ to $5 \times 10^{15}$cm$^{-2}$ and a rate of from $2 \times 10^{12}$sec$^{-1}$ to $5 \times 10^{12}$sec$^{-1}$ using a proton scan raster pattern ensuring uniformity of dose over the area of the device; and mounting the processed semiconductor material on to a heat sink and connecting one or more of said gold pads to a connection block.

2. A method according to claim 1 wherein the photolithographic mask is produced in two stages so that the plated gold layer has a thickness of from 8 to 12μm and a diameter from 10 to 35% less than that of the sputtered layers.

3. A method according to claim 1 wherein the n$^-$substrate material is thinned in a two stage process comprising abrasive lapping down to 60 to 80μm and chemical etching down to 10 to 15μm.

4. A method according to claim 1 in which the semiconductor material selected has less than 103 defects cm$^{-3}$.

5. A method according to claim 1 wherein following p$^+$ diffusion, the diffused surface is cleaned successively with organic solvents, concentrated acids and distilled water.

* * * * *